(12) United States Patent
Bao et al.

(10) Patent No.: US 7,981,741 B2
(45) Date of Patent: Jul. 19, 2011

(54) HIGH-CAPACITANCE DENSITY THIN FILM DIELECTRICS HAVING COLUMNAR GRAINS FORMED ON BASE-METAL FOILS

(75) Inventors: Lijie Bao, Wilmington, DE (US); Zhigang Rick Li, Hockessin, DE (US); Damien Reardon, Wilmington, DE (US); James F. Ryley, Glen Mills, PA (US); Cengiz A. Palanduz, Durham, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 712 days.

(21) Appl. No.: 11/832,995

(22) Filed: Aug. 2, 2007

(65) Prior Publication Data

US 2009/0035913 A1 Feb. 5, 2009

(51) Int. Cl.
*H01L 21/8242* (2006.01)
*H01L 21/20* (2006.01)
*H01L 27/108* (2006.01)
*H01L 29/94* (2006.01)

(52) U.S. Cl. .. 438/240; 438/393; 257/310; 257/E21.008

(58) Field of Classification Search .............. 438/3, 240, 438/393; 257/310, E21.008
See application file for complete search history.

(56) References Cited

U.S. PATENT DOCUMENTS

| 4,321,310 | A | 3/1982 | Ulion et al. |
| 4,717,632 | A | 1/1988 | Keem et al. |
| 6,060,735 | A | 5/2000 | Izuha et al. |
| 6,417,110 | B1 * | 7/2002 | Boyer ........................ 438/700 |
| 6,498,044 | B1 | 12/2002 | Park |
| 6,964,873 | B2 | 11/2005 | Matsuura et al. |
| 7,029,971 | B2 | 4/2006 | Borland et al. |
| 7,375,412 | B1 | 5/2008 | Palanduz et al. |
| 2002/0177243 | A1 | 11/2002 | Matsuura et al. |
| 2003/0064587 | A1 | 4/2003 | Han et al. |
| 2006/0220176 | A1 * | 10/2006 | Palanduz ...................... 257/532 |
| 2007/0025059 | A1 | 2/2007 | Uchida et al. |

FOREIGN PATENT DOCUMENTS

| EP | 0152673 A2 | 8/1985 |
| EP | 1096570 A1 | 5/2001 |
| EP | 1498944 A1 | 1/2005 |
| WO | 8101983 A1 | 7/1981 |
| WO | 2006110411 A1 | 10/2006 |

OTHER PUBLICATIONS

Dawley, J. T. et al., Dielectric properties of random and [100] oriented SrTiO3 and (Ba,Sr)TiO3 thin films fabricated on [100] nickel tapes, Applied Physics Letters, Oct. 14, 2002, pp. 3028-3030, vol. 81, No. 16.

Maria, Jon-Paul et al., Lead Zirconate Titanate Thin Films on Base-Metal Foils: An Approach for Embedded High-Permittivity Passive Components, Journal of the American Ceramic Society, 2001, pp. 2436-2438, vol. 84, No. 10.

European Search Report dated Jan. 16, 2009, EP Application No. 08013082.6-2214.

(Continued)

*Primary Examiner* — Matthew C Landau
*Assistant Examiner* — Daniel Luke

(57) ABSTRACT

Deposited thin-film dielectrics having columnar grains and high dielectric constants are formed on heat treated and polished metal foil. The sputtered dielectrics are annealed at low oxygen partial pressures.

19 Claims, 5 Drawing Sheets

OTHER PUBLICATIONS

S. Hoffman & R. Waser (1999) Control of Morphology of CSD-prepared (Ba,Sr) TiO3 Thin Films, J. Euro. Ceram. Soc. 64: 1339-1343.

S. Hoffman et al. (1997) Chemical Solution Deposited BaTiO3 and SrTiO3 Thin Films with Columnar Microstructure, Mat. Res. Soc. Symp. Proc. 74: 9-14.

T. Suzuki et al. (2000) Effect of Nonstoichiometry on Microstructure of Epitaxially Grown BaTiO3 Thin Films, Jpn. J. Appl. Phys. 39: 5970-5976.

J.T. Dawley & P.G. Clem (2002) Dielectric properties of random and <100> oriented SrTIO3 and (Ba, Sr)TiO3 thin films fabricated on <100> nickel tapes. Appl. Phys. Lett. 81: 3028-3030.

* cited by examiner

HIGH-CAPACITANCE DENSITY THIN FILM DIELECTRICS HAVING COLUMNAR GRAINS FORMED ON BASE-METAL FOILS

BACKGROUND OF THE INVENTION

1. Technical Field

The technical field is embedded capacitors. More particularly, the technical field includes capacitors on base metal foils having sputtered thin-film dielectrics that exhibit columnar grains.

2. Related Art

Since semiconductor devices including integrated circuits (IC) are operating at increasingly higher frequencies and data rates and at lower voltages, noise in the power and ground (return) lines and the need to supply sufficient current to accommodate the faster circuit switching becomes an increasingly important problem. In order to provide low noise and stable power to the IC, low impedance in the power distribution system is required. In conventional circuits, impedance is reduced by the use of additional surface mount technology (SMT) capacitors interconnected in parallel. The higher operating frequencies (higher IC switching speeds) mean that voltage response times to the IC must be faster. Lower operating voltages require that allowable voltage variations (ripple) and noise become smaller. For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin and the IC will trigger false gates. Additionally, as the IC powers up, a slow response time will result in power overshoot. Power droop and overshoot must be controlled within allowable limits by the use of capacitors that are close enough to the IC that they provide or absorb power within the appropriate response time.

Power droop and overshoot are maintained within the allowable limits by the use of capacitors providing or absorbing power in the appropriate response time. Capacitors are generally placed as close to the IC as possible to improve circuit performance. Conventional designs have capacitors surface mounted on the printed wiring board (PWB) clustered around the IC. Large value capacitors are placed near the power supply, mid-range value capacitors at locations between the IC and the power supply and small value capacitors very near the IC.

Large numbers of capacitors, interconnected in parallel, are often needed to reduce power system impedance. This requires complex electrical routing, which leads to increased circuit loop inductance, thereby reducing some of the beneficial effects of the surface mounted capacitors. As frequencies increase and operating voltages continue to drop, power increases and higher capacitance has to be supplied at increasingly lower inductance levels.

A solution would be to incorporate (i.e., embed) a high capacitance density, thin-film ceramic capacitor in the PWB package onto which the IC is mounted. A single layer ceramic capacitor directly under the IC reduces the inductance to a minimum and the high capacitance density provides enough capacitance to satisfy the IC requirements. Such a capacitor in the PWB can provide capacitance at a significantly quicker response time and lower inductance.

Embedment of high capacitance, ceramic film capacitors in printed wiring boards using fired-on-foil techniques is known. Achieving a high capacitance density capacitor by use of a dielectric with a high permittivity or dielectric constant (K), such as barium titanate based compositions, and a thin-film dielectric is also known. In addition, thin-film capacitor dielectrics with a thickness of less than 1 micron are known. Chemical solution deposition and sputtering techniques for fired-on-foil thin-film capacitor fabrication is disclosed in U.S. Pat. No. 7,029,971 to Borland et al.

Initial deposition is either amorphous or crystalline or a combination of both depending upon deposition conditions. Amorphous compositions have low dielectric constants. High dielectric constants can only be achieved in crystalline phases. The high K ferroelectric tetragonal phase in barium titanate based dielectrics can only be achieved when grain sizes exceed approximately 0.1 micrometers and so firing of the deposited dielectric at high temperatures is performed to induce full crystallization and grain growth. This results in formation of the high K phase and an improved dielectric constant.

Sputtered dielectrics are often preferred due to their high level of densification. Sputtering, however, deposits a microcrystalline dielectric having grain sizes that are about one tenth to one hundredth of the desired value, which means that sputtered capacitor dielectrics have low dielectric constants such as 400-600. This means grain sizes remain small due to their micro-crystalline characteristics and dielectric constants remain relatively low.

The problem to be solved, then, is to provide a sputtered dielectric having grain sizes that consequently yield high dielectric constants.

SUMMARY

The methods described herein provide making a sputtered thin-film dielectric that exhibits columnar grains. Columnar grains result in a high dielectric constant dielectric layer, thereby allowing the fabrication of a high capacitance density capacitor.

Capacitors constructed according to the methods described herein can be embedded into printed wiring boards. The capacitors have high capacitance densities, low loss tangents, high breakdown voltages and other desirable electrical and physical properties.

BRIEF DESCRIPTION OF THE DRAWINGS

According to common practice, the various features of the drawings discussed herein are not necessarily drawn to scale. Dimensions of various features and elements in the drawings may be expanded or reduced to more clearly illustrate the embodiments of the invention.

The detailed description will refer to the following drawings, wherein like numerals refer to like elements, and wherein.

DETAILED DESCRIPTION

Definitions

The methods described below are discussed in the following terms:

As used herein, the terms "annealing" and "firing" are interchangeable and refer to either processing the metallic foil or the dielectric at an elevated temperature, such as greater than 700° C.

As used herein, the term "substantially equal in size" refers to a size that one of skill in the art would recognize as not different from a compared thickness.

As used herein, the terms "high dielectric constant", "high Dk" and "high permittivity" are interchangeable and refer to dielectric materials that have a bulk dielectric constant above 500.

As used herein, "capacitance density" refers to the measured capacitance of the capacitor divided by the common area of the electrodes of the capacitor. Capacitance density is related to the dielectric constant by the relationship:

$$C/A = 0.885 K/t$$

where C/A is the capacitance density in nana Farads (nF) divided by the common electrode area expressed in square centimeters ($cm^2$);
K is the dielectric constant;
t is the thickness in micrometers (microns); and
0.885 is a constant (permittivity of free space).

Figure 1A:
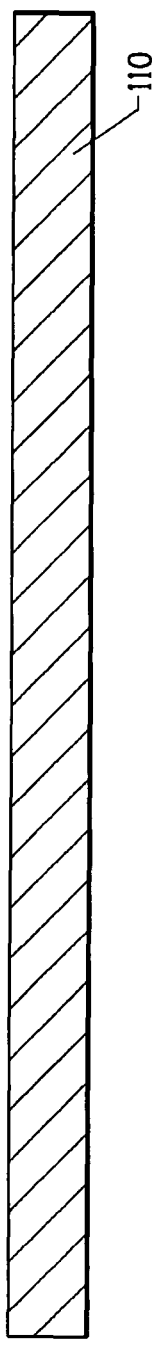
FIG. 1A-1D is a general method of fabrication capacitors on metal foils according to the present invention

FIG. 1A is a side elevational view of a first stage of forming high dielectric constant capacitors on base metal foils wherein the dielectric exhibits columnar grains. In FIG. 1A, a metallic foil 110 is provided. The foil 110 may be of a type generally available in the industry. For example, the foil 110 may be copper (Cu) or its alloys, copper-invar-copper, invar, nickel (Ni), nickel-coated copper, or other metals or metal alloys that have melting points in excess of the firing temperature for thin-film dielectrics. Preferred foils include foils comprised predominantly of copper or nickel. The thickness of the foil 110 may be in the range of, for example, between 1 and 100 microns, preferably between 3 and 75 microns. Examples of a suitable nickel foil include Nickel 201 foil that is 76.2 microns thick or that is 25.4 microns thick, both obtainable from All Foils Inc. An example of a suitable copper foil is PLSP grade 1 ounce copper foil that is 36 microns thick and obtainable from Oak-Mitsui.

Foil 110 is annealed at a temperature above which the thin-film dielectric will be fired but below the melting point of the foil. For example, in the case of copper, annealing of the foil may be carried out at a temperature of up to 1050° C. For nickel foil, annealing may be carried out at a temperature as high as 1400° C. Generally however, the foil is annealed at a temperature 100-200° C. above the firing temperature of the dielectric. For example, if the dielectric is to be fired at 900° C., the foil may be annealed at 1000-1100° C. for 1 to 2 hours. The annealing occurs in a sufficiently low partial pressure of oxygen so that residual surface oxide on the metal foil is thermodynamically reduced to pure metal. The appropriate atmosphere depends on the metal foil, but for nickel, for example, it may be a partial pressure of oxygen ($PO_2$) of approximately $1 \times 10^{-15}$ atmospheres. Such an atmosphere may be obtained by use of forming gas. Annealing of the metal foil causes re-crystallization and substantial grain growth in the metal. After annealing, many grains may extend across the entire thickness of the foil so they are substantially equal in size to the thickness of the metal foil. For example, if the foil is 25 micrometers thick, many grains may grow to have x, y and z dimensions of approximately 25 micrometers and the foil has only one grain across its thickness in many areas. Any subsequent heating below the foil annealing temperature, therefore, will not materially change the foil characteristics.

After annealing, the foil is polished by a variety of mechanical or chemical methods. Polishing creates a smooth surface so that shorting in the thin-film dielectric by surface irregularities is decreased. The polishing also creates a template of smooth enlarged grains that promote dielectric grain growth normal to the foil surface.

Figure 1B:
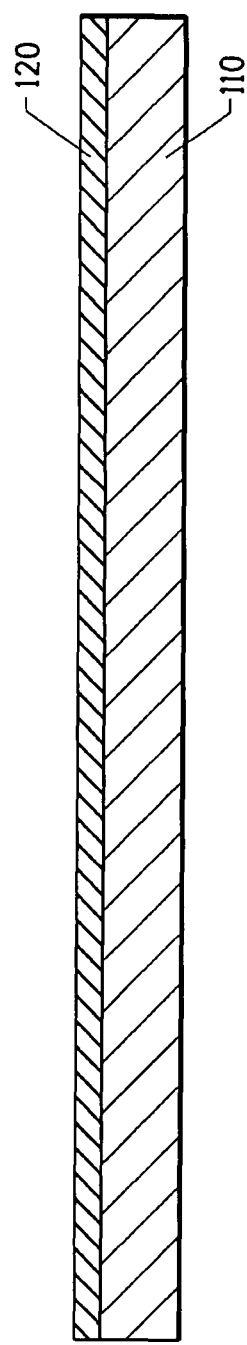

In FIG. 1B, a capacitor dielectric layer 120 is deposited over the annealed and polished metallic foil substrate to coat the entirety of the foil. Thin-film dielectrics can be deposited onto a metallic foil by sputtering, laser ablation, chemical vapor deposition, and chemical solution deposition. Sputtering is preferred due to the high level of densification of the deposited dielectric. During sputtering, the metal foil is heated at an elevated temperature, such as 400° C.-900° C., under undoped argon, argon-oxygen mixtures or other appropriate gases to avoid significant oxidation of the foil. Sputtering onto a metallic foil heated at such elevated temperatures allows for improved density of the deposited dielectric film. The combined heating of the foil during sputtering and the large grained polished foil surface promotes columnar grain growth on the initial seeded nuclei. The growth occurs normal (perpendicular) to the foil surface. The absence of large numbers of grain boundaries in the underlying metal foil due to its large grain sizes facilitates dielectric grains to grow in the x and y direction, which prevents micro-grains normally associated with room temperature sputtering.

After sputtering to the desired thickness, the dielectric on the metal foil is fired. Firing fully crystallizes and further densifies the deposited dielectric layer 120. Firing also promotes more grain growth resulting in higher dielectric constants.

Firing of the dielectric may be conducted in a low oxygen partial pressure ($PO_2$) environment to protect the underlying metal foil from oxidation. However, in firing the dielectric, higher $PO_2$ levels are more desirable in order to minimize oxygen vacancy and free electron formation due to reduction of the dielectric. Thus, the highest $PO_2$ level is chosen that does not cause significant oxidation of the metallic foil. A small level of oxidation is acceptable but a high level of oxidation reduces the effective dielectric constant of the dielectric and is to be avoided. The optimum oxygen partial pressure depends on the metal foil, dopant type and concentration if used, and the firing temperature but ranges from approximately $10^{-6}$ to $10^{-12}$ atmosphere.

Suitable temperatures at which the dielectric is fired depend on the underlying metallic foil and the dielectric micro-structure desired. The firing temperature of the dielectric is generally below the temperature at which the foil was first annealed, but above the temperature at which the metal foil was heated to during the sputtering of the dielectric. For example, if the metal foil was first annealed at 1000° C. and during sputtering, it was subsequently heated at 700° C., then firing of the dielectric may occur at between approximately 800° C. and 900° C. Firing of the dielectric may be performed in the sputtering chamber or a separate furnace. Firing in the sputtering chamber is particularly useful in that the coated foil remains in the chamber and does not need to be handled, minimizing the possibility of surface contamination. The low oxygen partial pressure may be achieved by use of high purity argon, nitrogen and/or vacuum. Other gas combinations are possible.

The above-described process promotes columnar grain growth, which enlarges the grains resulting in an increased dielectric constant of the dielectric film. The choice of the appropriate atmosphere during firing of the dielectric minimizes both oxidation of the underlying metal foil and oxygen vacancy and free electron formation in the dielectric. Minimized oxygen vacancy and free electron formation allows for improved dielectric properties, such as breakdown voltage and insulation resistance.

After firing the dielectric, the coated foil is allowed to cool.

Figure 1C:
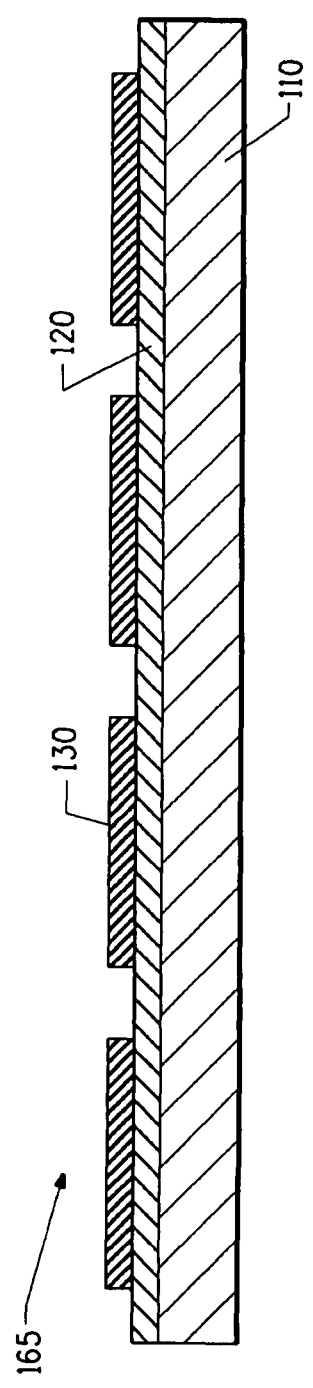
Figure 1D:
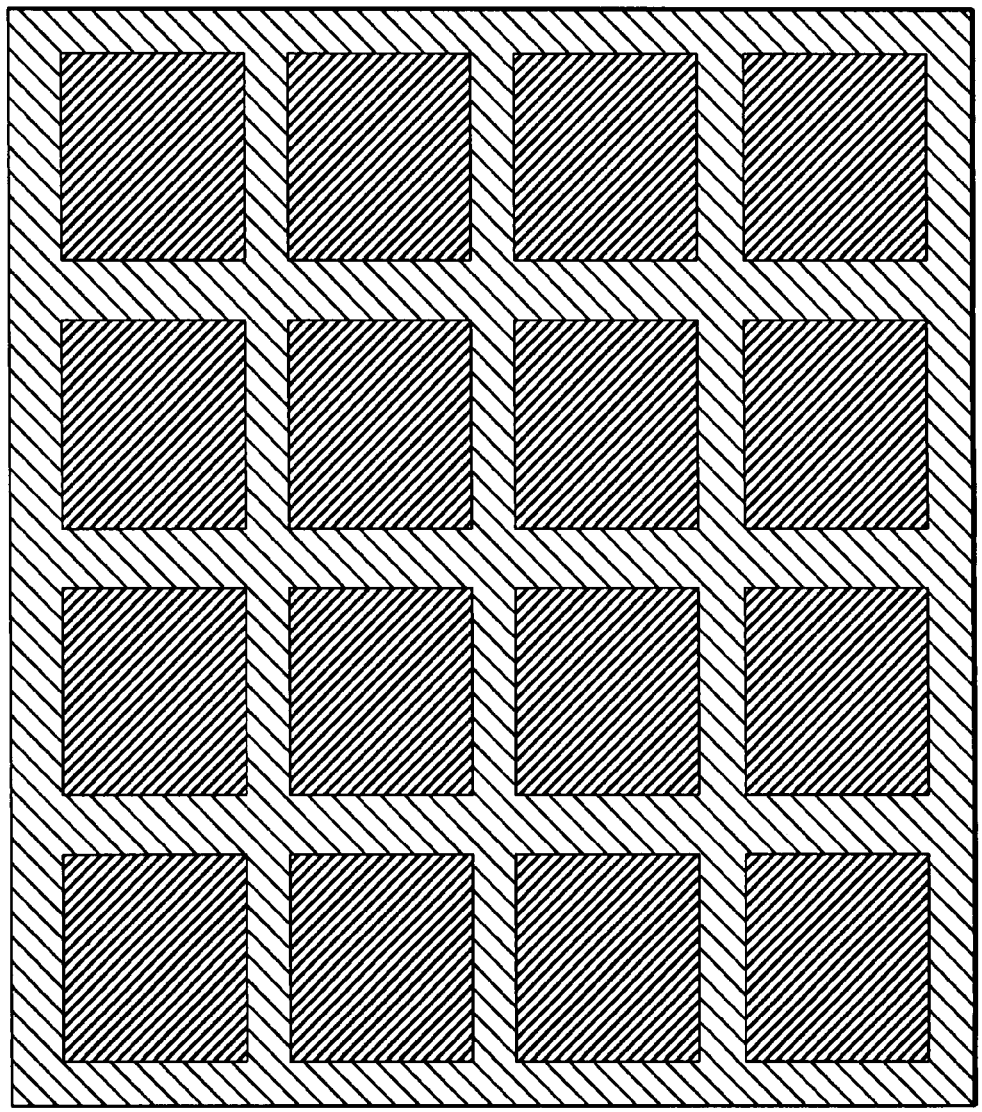

In FIG. 1C, electrodes 130 are formed over the fired dielectric layer 120 to form the article 165. Electrodes 130 may be formed by, for example, sputtering through a mask but other methods are possible. Typically the sputtered electrode will be less than 1 micron in thickness and comprise copper but any metal may be used. A plan view of the article 165 is shown in FIG. 1D. In FIG. 1D, 16 capacitors are shown but any number may be fabricated on the metal foil.

The methods described herein for processing the dielectric provide desirable physical and electrical properties. One such physical property is a dense microstructure; another is resultant columnar grains. A desirable electrical property resulting from the grain size is a capacitance density of the order of 1 micro Farad per square centimeter (1 $\mu F/cm^2$). Another desirable electrical property is a breakdown voltage in excess of 10 volts. Further, the methods described herein are environmentally friendly in terms of both materials and processes.

In these methods, barium titanate ($BaTiO_3$) based materials are used as the sputtered dielectric because they have high dielectric constants and are lead free. Other materials with high dielectric constants include perovskites of the general formula $ABO_3$ in which the A site and B site can be occupied by one or more different metals may be used. For example, high K is realized in crystalline barium titanate (BT), lead zirconate titanate (PZT), lead lanthanum zirconate titanate (PLZT), lead magnesium niobate (PMN) and barium strontium titanate (BST) and these materials are commonly used in surface mount component devices.

Transition metal cations such as zirconium (Zr), hafnium (Hf), tin (Sn) and cerium (Ce) having the preferred oxide stoichiometry of $MO_2$ may substitute for titanium. Transition metal cations smooth the temperature-dependence of permittivity in the dielectric by "pinching" (shifting) the three phase transitions of $BaTiO_3$ closer to one another in temperature space.

Metal cations having the preferred oxide stoichiometry of MO, where M is an alkaline earth metal (e.g., calcium [Ca], strontium [Sr] and magnesium [Mg]), may substitute for barium as these can shift the dielectric temperature maxima to lower temperatures, further smoothing the temperature-dependent response of the dielectric.

Dopant cations may be also be added to the barium titanate targets to modify the dielectric characteristics. For example, small quantities of dopant rare earth cations having the preferred oxide stoichiometry of $R_2O_3$, where R is a rare earth cation (e.g., yttrium [Y], holmium [Ho], dysprosium [Dy], lanthanum [La] and europium [Eu]) may be added to the target composition to improve insulation resistance and reliability of the resulting sputtered dielectric. Small atomic radii cations of the oxide stoichiometry MO such as calcium (Ca), magnesium (Mg), or nickel (Ni) as well as transition metal cations such as manganese (Mn), chromium (Cr), cobalt (Co) and iron (Fe) may be used to dope the titanium site to improve insulation resistance of the dielectric. The above-described dopants or mixtures of these may be used in various concentrations. A preferred range of concentrations is between about 0 and 5 mole percent.

The following example illustrates favorable properties in dielectrics on metal foils prepared according to the methods described herein.

Example 1

A 76.2 micron thick 201 type nickel foil obtained from All Foils Inc. was cut to a size of 62 mm by 62 mm and ultrasonically cleaned with acetone for 5 minutes followed by an ultrasonic rinse with a mix of de-ionized water and industrial propyl alcohol. The nickel foil was then annealed at 1000° C. for a period of 90 minutes at peak temperature under a partial pressure of oxygen of between $10^{-14}$ to $10^{-15}$ atmosphere. This atmosphere was accomplished by use of a mixture of forming gas (1% hydrogen in nitrogen) and nitrogen. The annealing induced grain growth in the metal foil. After annealing, many grains of the nickel extended across the entire thickness of the foil so that they were substantially equal in size to the thickness of the foil.

The annealed nickel foil was polished using a chemical mechanical polishing process to a mirror finish. After polishing, the foil was ultrasonically cleaned for 5 minutes in acetone followed by an ultrasonic rinse in a mix of de-ionized water and industrial propyl alcohol.

The nickel foil was placed into a sputtering chamber and the chamber was evacuated to 3 milli Torr under an atmosphere composed of approximately 95% argon and 5% oxygen. The metal foil was heated at 650° C. Barium titanate was then sputtered onto the entirety of the polished surface of the nickel foil using a 4 inch diameter barium titanate target using RF power of 200 watts. The deposition time was 120 minutes, resulting in a dielectric thickness of approximately 0.65 microns.

The coated foil was then heated at 900° C. in the sputtering chamber to fire the dielectric. The temperature was held for a period at peak temperature for 2 hours. The oxygen partial pressure during firing of the dielectric was measured at $3\times10^{-7}$ atmospheres. After firing the dielectric, the coated foil was allowed to cool. The coated foil was removed from the sputtering chamber. Nine copper top electrodes, each 1 cm by 1 cm, were deposited onto the dielectric surface by electron beam deposition.

The capacitance and the loss tangent were measured under conditions of 1.3 dc volts, 1 KHz and an oscillating voltage of 50 millivolts rms. The measured capacitance was 1280 nana Farads resulting in a capacitance density of 1280 $nF/cm^2$. The calculated effective dielectric constant of the film was approximately 940. The loss tangent was 0.23. The capacitor was also able to withstand positive and negative 10 volts bias without any change in capacitance.

Another capacitor fabricated under the same conditions was measured under different conditions. The capacitance and loss tangent was measured using 0 dc volts, 1 KHz and an oscillation voltage of 50 millivolt rms. The measured capacitance was 1710 nana Farads resulting in a capacitance density of 1710 $nF/cm^2$. The calculated effective dielectric constant of the dielectric film was approximately 1256. The loss tangent was 0.109. The capacitor was also able to withstand positive and negative 10 volts bias without any change in capacitance.

Figure 2:
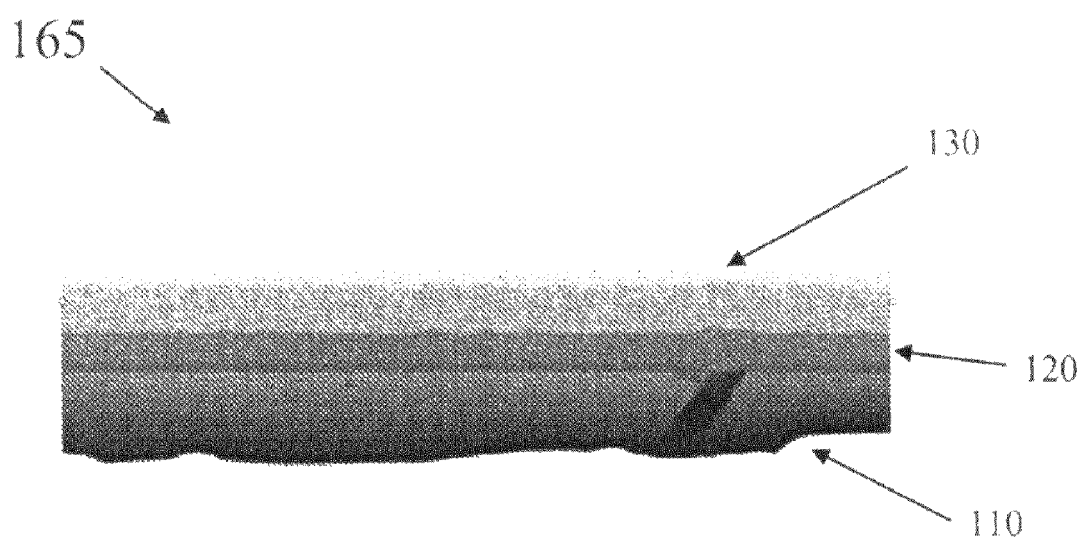
FIG. 2 is a low magnification electron microscopy image of a cross section of a capacitor fabricated according to example 1 and labeled with the appropriate identification numerals to relate the experimental samples to the schematic examples of FIG. 1.
Figures 3A, 3B:
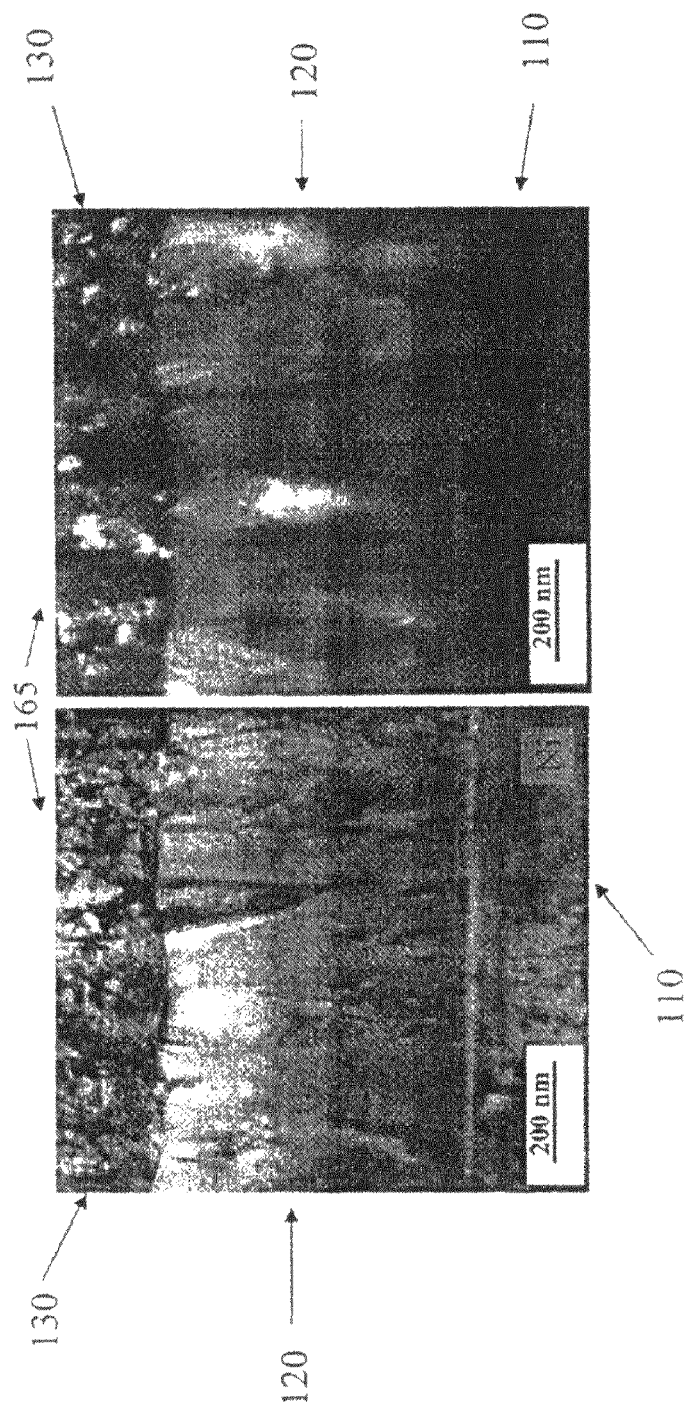
FIGS. 3 and 4 are higher magnifications of the electron microscopy image of example 1 showing columnar grains 50-100 micrometers in diameter.
Figure 4:
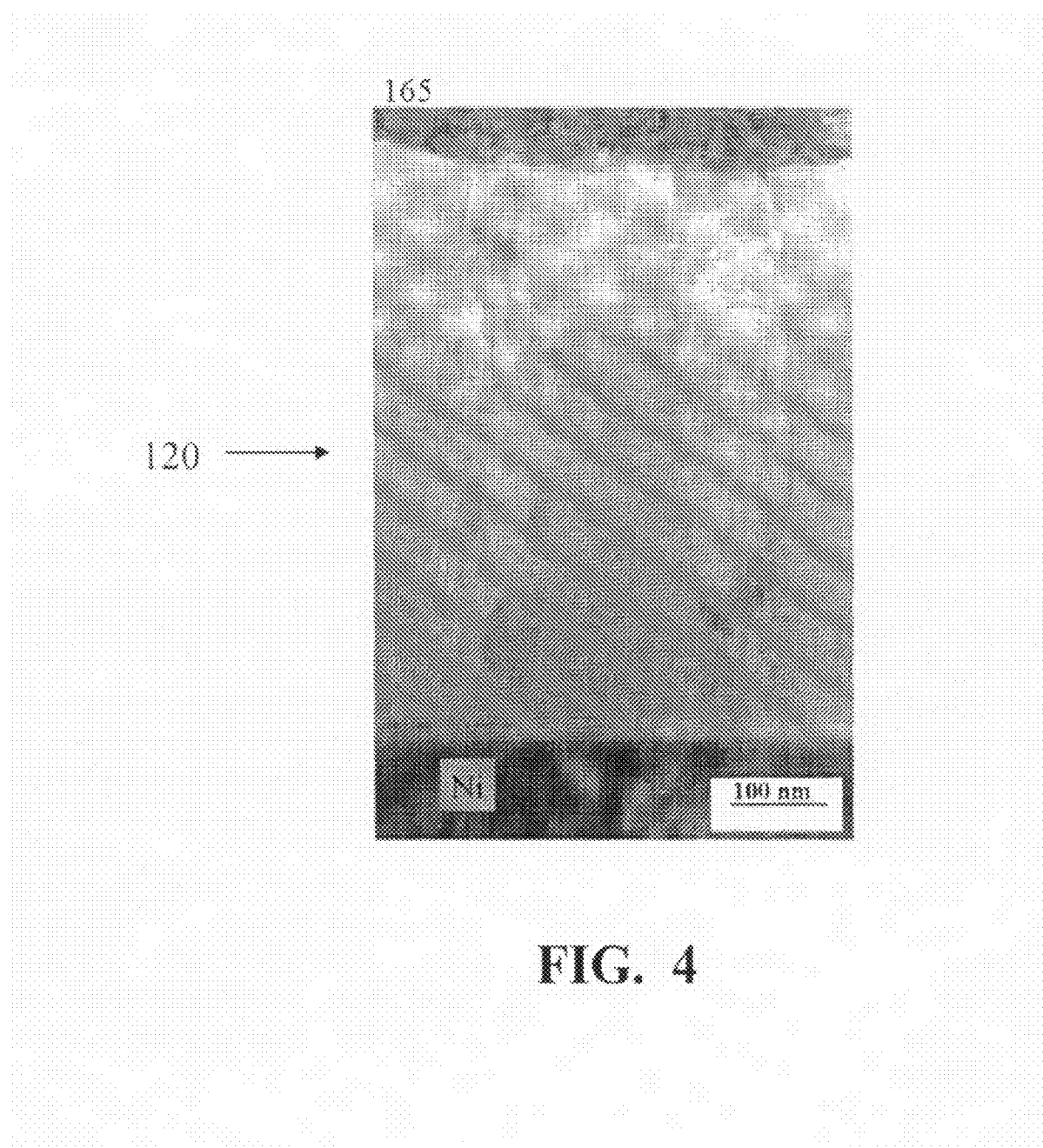

The capacitor was cross-sectioned and examined using transmission electron microscopy. The results of the microscopy are shown in FIGS. 2, 3 and 4. FIG. 2 shows a low magnification image, in cross-section, of the sample of example 1. The cross-section is labeled with the identification numerals used in the schematic examples of FIG. 1 for purposes of clarity. FIGS. 3 and 4 show higher magnifications of the cross-section. It can clearly be seen in FIGS. 3 and 4 that the dielectric has a columnar grain structure with grains that are between 50 and 100 microns in diameter, thus accounting for the improved dielectric constant.

What is claimed is:

1. A method of making a capacitor, comprising in sequence:

providing a metallic foil having a thickness of between about 1 and 100 microns, and having a first surface;

annealing the metallic foil for a first time, wherein the metallic foil annealed for the first time obtains grain sizes substantially equal in size to the thickness of the foil;

polishing the first surface of the metallic foil;

forming a capacitor over the first surface of the metallic foil, wherein the forming comprises:

depositing a thin-film dielectric layer over the first surface of the metallic foil when said metallic foil is heated at a temperature between about 400° C. and 900° C., the dielectric layer comprising a material of high dielectric constant;

firing the dielectric layer; and forming a conductive layer over the dielectric layer, wherein the dielectric layer of the capacitor exhibits columnar grains.

2. The method of claim 1, wherein the depositing of the thin-film dielectric layer is done by sputtering.

3. The method of claim 1, further comprising: firing the dielectric layer in an atmosphere having an oxygen partial pressure of less than about $10^{-6}$ atmospheres.

4. The method of claim 1, wherein the annealing of the metallic foil for the first time occurs at a temperature between about 900° C. and 1400° C.

5. The method of claim 2, wherein the firing of the dielectric layer is conducted in an atmosphere having an oxygen partial pressure of less than about $10^{-6}$ atmospheres and wherein the annealing of the metallic foil for the first time occurs at a temperature between about 900° C. and 1400° C.

6. The method of claim 1, wherein the material of high dielectric constant is selected from the group consisting of barium titanate, barium strontium titanate, lead zirconate titanate, lead magnesium niobate, lead lanthanum zirconate titanate and mixtures thereof.

7. The method of claim 1 wherein the material of high dielectric constant is a doped composition.

8. The method of claim 1, wherein the firing of the dielectric layer occurs at a temperature lower than the temperature at which the metallic foil was annealed for the first time.

9. The method of claim 2, wherein the firing of the dielectric layer occurs at a temperature lower than the temperature at which the metallic foil was annealed for the first time.

10. The method of claim 1, wherein the firing of the dielectric layer occurs at a temperature of between about 700° C. and 1400° C.

11. The method of claim 2, wherein the firing of the dielectric layer occurs at a temperature of between about 700° C. and 1400° C.

12. The method of claim 1, wherein the deposited dielectric layer has a thickness in the range between about 0.2 and 2.0 micrometers.

13. The method of claim 2, wherein the sputtered dielectric layer has a thickness in the range between about 0.2 and 2.0 micrometers.

14. The method of claim 1, wherein the capacitor has a capacitance density of about 1 $\mu F/cm^2$ or greater.

15. The method of claim 2, wherein the capacitor has a capacitance density of about 1 $\mu F/cm^2$ or greater.

16. A printed wiring board comprising an embedded capacitor made by the method of claim 1.

17. A printed wiring board comprising an embedded capacitor made by the method of claim 2.

18. A printed wiring board comprising an embedded capacitor made by the method of claim 3.

19. The method of claim 1, wherein the metallic foil comprises metal from the group of copper, invar, and nickel.

* * * * *